United States Patent
Mukaida et al.

(10) Patent No.: US 10,243,612 B2
(45) Date of Patent: Mar. 26, 2019

(54) WIRELESS APPARATUS, METHOD AND NON-TRANSITORY COMPUTER-READABLE STORAGE MEDIUM

(71) Applicant: FUJITSU LIMITED, Kawasaki-shi, Kanagawa (JP)

(72) Inventors: Kyosuke Mukaida, Kawasaki (JP); Hideyuki Kannari, Yokohama (JP); Hiroyuki Sekino, Yokohama (JP); Tadahiro Sato, Yokohama (JP); Yusuke Tobisu, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 16/026,644

(22) Filed: Jul. 3, 2018

(65) Prior Publication Data

US 2018/0316385 A1 Nov. 1, 2018

Related U.S. Application Data

(63) Continuation of application No. PCT/JP2016/052210, filed on Jan. 26, 2016.

(51) Int. Cl.
*H04B 1/7107* (2011.01)
*H04B 1/7105* (2011.01)
(Continued)

(52) U.S. Cl.
CPC ......... *H04B 1/7107* (2013.01); *H03F 1/3211* (2013.01); *H04B 1/525* (2013.01);
(Continued)

(58) Field of Classification Search
CPC ...... H04B 1/7107; H04B 1/709; H04B 1/525; H04B 1/71052; H04W 88/12; H03F 2200/372; H03F 1/3211
See application file for complete search history.

(56) References Cited

U.S. PATENT DOCUMENTS

| | | |
|---|---|---|
| 5,940,519 A | 8/1999 | Kuo |
| 2003/0232600 A1 | 12/2003 | Montgomery et al. |

(Continued)

FOREIGN PATENT DOCUMENTS

| | | |
|---|---|---|
| JP | 10-190589 A | 7/1998 |
| JP | 2005-521326 A | 7/2005 |

(Continued)

OTHER PUBLICATIONS

Internationa Search Report for PCT/JP2016/052210 dated Apr. 19, 2016.

*Primary Examiner* — Jean B Corrielus
(74) *Attorney, Agent, or Firm* — Arent Fox LLP

(57) ABSTRACT

A wireless apparatus configured to be cascaded to another wireless apparatus through a transmission path and to be coupled to an antenna multiplexer, the another wireless apparatus being coupled to the antenna multiplexer, the wireless apparatus includes a processor configured to specify a first time length for a first transmission signal having a first frequency band to pass through the wireless apparatus, specify a second time length for a second transmission signal having a second frequency band to pass through the wireless apparatus, the transmission path, and the another wireless apparatus, specify a difference between the first time length and the second time length, delay the second transmission signal by the specified difference, generate a cancellation signal for an intermodulation distortion that occurs in a received signal due to intermodulation between the first transmission signal and the second transmission signal, and combine the cancellation signal with the received signal.

18 Claims, 16 Drawing Sheets

(51) Int. Cl.
*H04B 1/525* (2015.01)
*H04B 1/709* (2011.01)
*H03F 1/32* (2006.01)
*H04W 88/12* (2009.01)

(52) U.S. Cl.
CPC ......... *H04B 1/709* (2013.01); *H04B 1/71052* (2013.01); *H03F 2200/372* (2013.01); *H04W 88/12* (2013.01)

(56) References Cited

U.S. PATENT DOCUMENTS

| | | |
|---|---|---|
| 2004/0048576 A1* | 3/2004 | Hildebrand ............ H04B 1/525 455/67.13 |
| 2006/0248564 A1 | 11/2006 | Zinevitch |
| 2007/0184782 A1 | 8/2007 | Sahota et al. |
| 2008/0232327 A1 | 9/2008 | Kuroyamagi et al. |
| 2014/0119296 A1 | 5/2014 | Akutagawa |
| 2015/0333784 A1 | 11/2015 | Bevan et al. |
| 2016/0134311 A1* | 5/2016 | Itkin ................. H04B 17/0085 375/346 |

FOREIGN PATENT DOCUMENTS

| | | |
|---|---|---|
| JP | 2005-260900 A | 9/2005 |
| JP | 2008-532388 A | 8/2008 |
| JP | 2009-526442 A | 7/2009 |
| JP | 2014-093589 A | 5/2014 |
| WO | WO 2014/085345 A1 | 6/2014 |

\* cited by examiner

US 10,243,612 B2

WIRELESS APPARATUS, METHOD AND NON-TRANSITORY COMPUTER-READABLE STORAGE MEDIUM

CROSS-REFERENCE TO RELATED APPLICATION

This application is a continuation application of International Application PCT/JP2016/052210 filed on Jan. 26, 2016 and designated the U.S., the entire contents of which are incorporated herein by reference.

FIELD

The embodiments discussed herein are related to a wireless apparatus, a method and a non-transitory computer-readable storage medium.

BACKGROUND

In some of conventional wireless apparatuses in which an antenna is used both for transmission and reception, an antenna multiplexer, such as a duplexer, is coupled. That is, when the transmit signal and the received signal have different frequencies, an antenna multiplexer is coupled to an antenna, and thereby the transmit path and the receive path are electrically separate in a wireless apparatus. Therefore, the transmit signal will not interfere with the received signal, and degradation in the reception quality may be reduced.

However, with the antenna multiplexer, which is configured mainly with a filter, it is difficult to completely inhibit a transmit signal from leaking to the receive path. Therefore, in some cases, a leaking transmit signal and a received interference signal cause intermodulation in the receive path, and a resultant intermodulation distortion degrades the reception quality. That is, when a transmit signal and a received signal have different frequencies, intermodulation between these signals causes an intermodulation distortion at a given frequency. If the frequency at which the intermodulation distortion has occurred is included in the frequency band of the received signal, demodulation and decoding of the received signal are hindered by the intermodulation distortion. As a result, the accuracy of received data obtained from the received signal decreases. Accordingly, there are discussed techniques, such as approximately reconstructing an intermodulation distortion based on the transmit signal and the interference signal and cancelling the intermodulation distortion by using a reconstructed signal obtained by the reconstruction. Japanese National Publication of International Patent Application No. 2009-526442 is an example of the related art.

SUMMARY

According to an aspect of the invention, a wireless apparatus configured to be cascaded to another wireless apparatus through a transmission path and to be coupled to an antenna multiplexer, the another wireless apparatus being coupled to the antenna multiplexer, the wireless apparatus includes a memory, and a processor coupled to the memory and configured to specify a first time length for a first transmission signal having a first frequency band to pass through the wireless apparatus, specify a second time length for a second transmission signal having a second frequency band to pass through the wireless apparatus, the transmission path, and the another wireless apparatus, specify a difference between the first time length and the second time length, delay the second transmission signal by the specified difference, generate, based on the first transmission signal and the delayed second transmission signal, a cancellation signal for an intermodulation distortion that occurs in a received signal received by the antenna multiplexer due to intermodulation between the first transmission signal and the second transmission signal in the antenna multiplexer, and combine the cancellation signal with the received signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
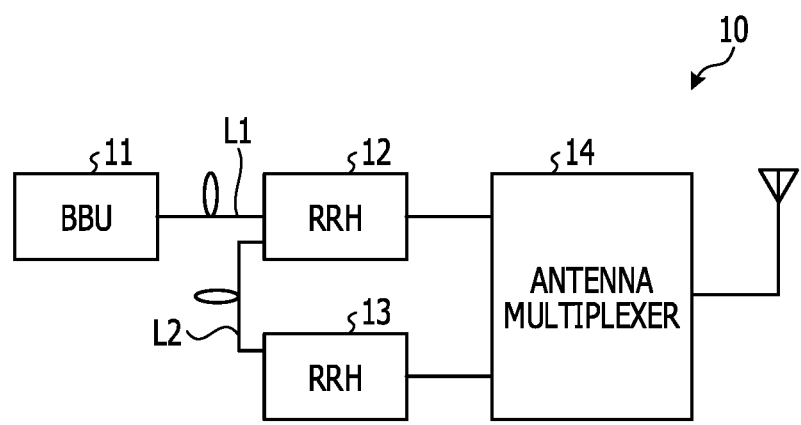
FIG. 1 is a block diagram illustrating a configuration of a base station system according to a first embodiment.

In recent years, the bandwidths of signals used for wireless communication have been increasingly broadened, and, for example, multi-carrier transmission in which signals are transmitted on a plurality of carriers in different frequency bands have become commercially practical. In multi-carrier transmission, a plurality of transmit signals in different frequency bands are transmitted, and therefore an intermodulation distortion due to intermodulation between the transmit signals in an antenna multiplexer sometimes occurs in a received signal.

In addition, an antenna multiplexer, an antenna, a cable that couples the antenna multiplexer to the antenna, and the like are linear circuits, and an intermodulation distortion caused by transmit signals will typically not occur in these components. However, an intermodulation distortion caused by transmit signals sometimes occurs in the linear circuits mentioned above, for example, because of internal factors, such as corrosion of a material and contamination of a junction plane of different kinds of metal, and external factors, such as magnetic fields and vibrations. Such an intermodulation distortion is called passive intermodulation (PIM) in some cases. The power of PIM is small as compared to the power of a transmit signal but, in general, the power of a received signal is smaller than the power of a transmit signal, and therefore the effects of PIM on the received signal are not negligible.

Furthermore, it is conceivable to cancel a distortion in a received signal to which an intermodulation distortion, such as PIM, has been added, by using a reconstructed signal obtained by approximately reconstructing the intermodulation distortion; however, depending on the accuracy of the reconstructed signal, a problem arises in that it is difficult to improve the reception quality. That is, it is difficult to completely reproduce an intermodulation distortion added to a received signal, and therefore part of a reconstructed signal may become noise when the reconstructed signal is added to the received signal to cancel an intermodulation distortion. As a result, noise added to the received signal actually increases, sometimes incurring degradation in the reception quality.

In contrast, it is also conceivable that a cancellation signal that handles an intermodulation distortion produced in a received signal by intermodulation between a plurality of transmit signals in different frequency bands is generated by using these transmit signals themselves. In this case, a new wireless apparatus having a function of generating a cancellation signal is coupled to an antenna multiplexer. That is, when an existing wireless apparatus without a function of generating a cancellation signal is coupled to an antenna multiplexer, the existing wireless apparatus is removed and then a new wireless apparatus having the function of generating a cancellation signal is coupled to the antenna multiplexer. However, removal of the existing wireless apparatus increases the cost for installing the new wireless apparatus and therefore is not practical. Thus, it is expected to generate a cancellation signal in the new wireless apparatus while allowing the existing wireless apparatus to remain.

In this respect, a configuration is conceivable in which a new wireless apparatus provided with a function of generating a cancellation signal and an existing wireless apparatus are cascaded via a cable, such as an optical fiber cable, and both the new wireless apparatus and the existing wireless apparatus are coupled to a single antenna multiplexer. With such a configuration, for example, a first transmit signal corresponding to a first frequency band passes through the new wireless apparatus to the antenna multiplexer, and a second transmit signal corresponding to a second frequency band passes through the new wireless apparatus, the cable, and the existing wireless apparatus to the antenna multiplexer. Then, the new wireless apparatus generates a cancellation signal for cancelling an intermodulation distortion produced in a received signal based on the first transmit signal and the second transmit signal.

However, there is a "delay time" between the first transmit signal and the second transmit signal transmitted from the new wireless apparatus and the existing wireless apparatus cascaded together. That is, the difference between the time for the first transmit signal to pass through the new wireless apparatus and the time for the second transmit signal to pass through the new wireless apparatus, the cable, and the existing wireless apparatus is the "delay time" mentioned above. Since the cancellation signal is generated based on the first transmit signal and the second transmit signal, the above "delay time" leaves a gap between the cancellation signal and an intermodulation distortion that has been actually produced in a received signal, and, as a result, the accuracy of the cancellation signal might decrease.

In view of such a respect, the disclosed techniques provide a wireless apparatus that may reduce a decrease in the accuracy of a cancellation signal for an intermodulation distortion caused by a delay time between a plurality of transmit signals transmitted from a plurality of cascaded wireless apparatuses.

According to an aspect of the wireless apparatus disclosed herein, a decrease in the accuracy of a cancellation signal for an intermodulation distortion caused by a delay time between a plurality of transmit signals in different frequency bands transmitted from a plurality of cascaded wireless apparatuses may be reduced.

First Embodiment

FIG. 1 is a block diagram illustrating a configuration of a base station system 10 according to a first embodiment. As illustrated in FIG. 1, the base station system 10 includes a baseband unit (hereinafter abbreviated as a "BBU") 11, a remote radio head (hereinafter abbreviated as an "RRH") 12, an RRH 13, and an antenna multiplexer 14. Note that it is assumed hereinafter that a frequency band A is assigned to the RRH 12 and a frequency band B different from the frequency band A is assigned to the RRH 13.

The BBU 11 transmits transmit data at baseband received from a core network, via an optical fiber L1 to the RRH 12. The transmit data transmitted by the BBU 11 includes transmit data corresponding to the frequency band A assigned to the RRH 12 and transmit data corresponding to the frequency band B assigned to the RRH 13. In addition, the BBU 11 transmits, to the core network, received data at baseband received via the optical fiber L1 from the RRH 12.

The RRH 12 is cascaded to the BBU 11 by the optical fiber L1. In addition, the RRH 12 is cascaded with the RRH 3 by the optical fiber L2 and, together with RRH 13, is coupled to the antenna multiplexer 14. The RRH 12 generates a "first transmit signal" and a "second transmit signal" from transmit data received via the optical fiber L1 from the BBU 11, outputs the "first transmit signal" to the antenna multiplexer 14, and transfers the "second transmit signal" via the optical fiber L2 to the RRH 13. The "first transmit signal" is a transmit signal generated from transmit data corresponding to the frequency band A, and the "second transmit signal" is a transmit signal generated from transmit data corresponding to the frequency band B. The RRH 12 also acquires received data from the received signal that has been received from the antenna multiplexer 14, and transmits the acquired received data via the optical fiber L1 to the BBU 11. The RRH 12 also acquires received data from the received signal that has been received from the RRH 13, and transmits the acquired received data via the optical fiber L1 to the BBU 11.

Furthermore, the RRH 12 generates a cancellation signal for cancelling an intermodulation distortion produced in a received signal due to intermodulation between the "first transmit signal" and the "second transmit signal" in the antenna multiplexer 14, and cancels the intermodulation distortion by using the cancellation signal. The RRH 12 is an example of a "wireless apparatus". Note that the configuration of the RRH 12 will be described in detail below.

The RRH 13 outputs, to the antenna multiplexer 14, the "second transmit signal" received via the optical fiber L2 from the RRH 12. The RRH 13 transfers, to the RRH 12, a received signal received from the antenna multiplexer 14. The RRH 13 is an example of "another wireless apparatus". Note that the configuration of the RRH 13 will be described in detail below.

The antenna multiplexer 14 transmits the "first transmit signal" output from the RRH 12 and the "second transmit signal" output from the RRH 13 via an antenna. The antenna multiplexer 14 also outputs, among received signals received by the antenna, a received signal in a receive frequency band assigned to the RHH 12 to the RRH 12 and outputs a received signal in a receive frequency band assigned to the RRH 13 to the RRH 13. The path from the antenna multiplexer 14 to the antenna is, for example, a linear circuit including a connector, a cable, an antenna, and the like. Various internal factors and external factors in these antenna multiplexer 14 and the linear circuit cause intermodulation between the "first transmit signal" and the "second transmit signal" in the antenna multiplexer 14 and the linear circuit, producing an intermodulation distortion such as PIM. In addition, the antenna multiplexer 14 and the linear circuit serve as a "travel path" along which both a transmit signal and a received signal travel, and therefore an intermodulation distortion produced by intermodulation between the "first transmit signal" and the "second transmit signal" in this "travel path" is added to the received signal.

Figure 2:
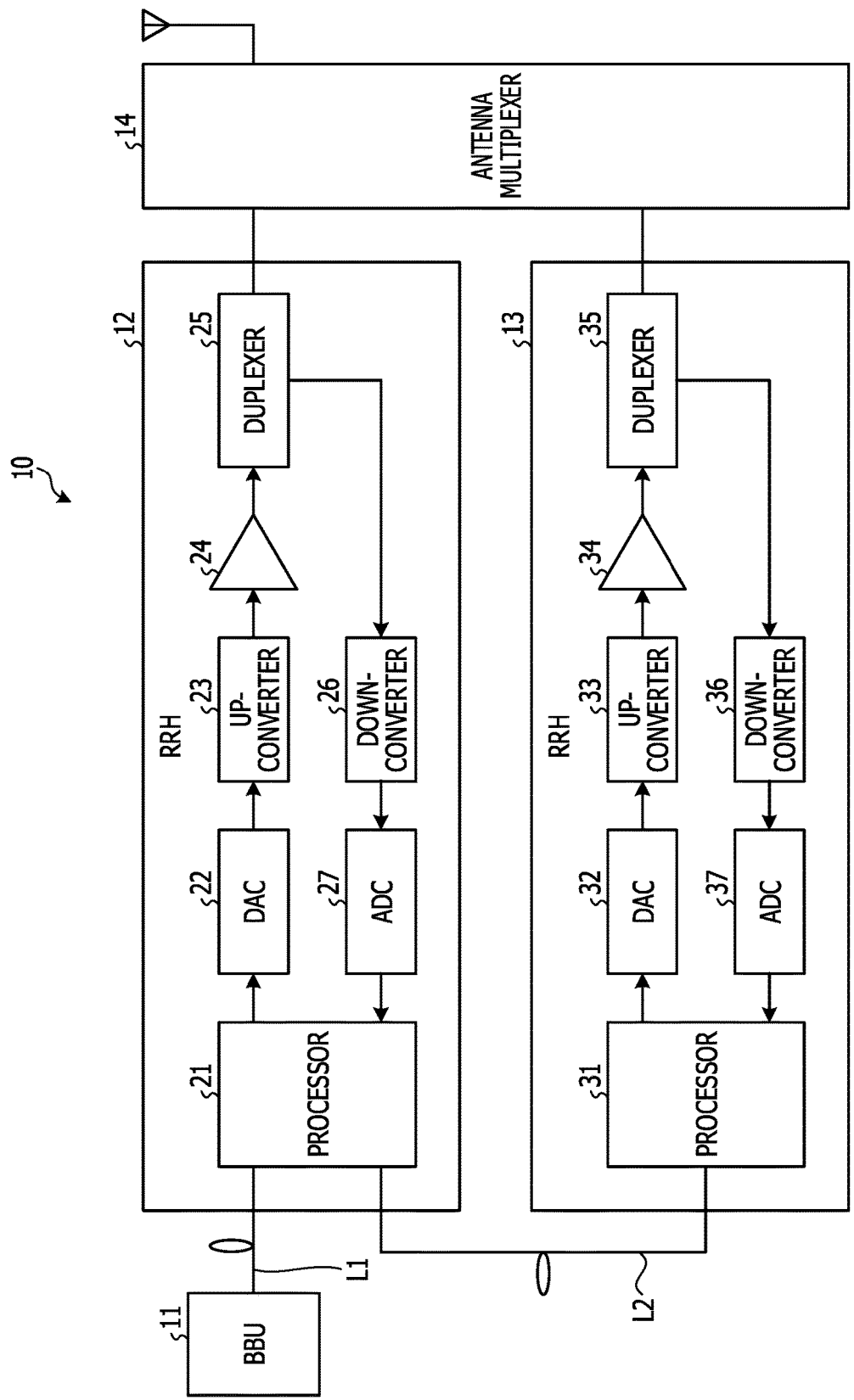
FIG. 2 is a block diagram illustrating a configuration of each RRH in the first embodiment.

FIG. 2 is a block diagram illustrating configurations of the RRHs 12 and 13 in the first embodiment. As illustrated in FIG. 2, the RRH 12 includes a processor 21, a digital-to-analogue converter (DAC) 22, an up-converter 23, an amplifier 24, a duplexer 25, a down-converter 26, and an analogue-to-digital converter (ADC) 27.

The processor 21 includes, for example, a central processing unit (CPU), a field programmable gate array (FPGA), a digital signal processor (DSP), or the like and executes various kinds of processing. Specifically, the processor 21 generates a "first transmit signal" and a "second transmit signal" from transmit data received via the optical fiber L1 from the BBU 11, outputs the "first transmit signal" to the DAC 22, and transfers the "second transmit signal" via the optical fiber L2 to the RRH 13. The processor 21 also acquires received data from a received signal that has been received from the ADC 27 and transmits the acquired received data via the optical fiber L1 to the BBU 11. The processor 21 also receives received data via the optical fiber L2 from the RRH 13 and transmits this received data via the optical fiber L1 to the BBU 11. Furthermore, the processor 21 generates a cancellation signal for cancelling an intermodulation distortion produced in a received signal by intermodulation between the "first transmit signal" and the "second transmit signal" in the antenna multiplexer 14, and cancels the intermodulation distortion by using the cancellation signal. Note that the functions of the processor 21 will be described in detail below.

The DAC 22 digital-to-analogue converts the "first transmit signal" output from the processor 21 and outputs the resultant analogue "first transmit signal" to the up-converter 23.

The up-converter 23 up-converts the "first transmit signal" output from the DAC 22 and outputs the "first transmit signal" at the resultant wireless frequency to the amplifier 24.

The amplifier 24 amplifies the "first transmit signal" output from the up-converter 23 and outputs the amplified "first transmit signal" to the duplexer 25.

The duplexer 25 outputs, to the antenna multiplexer 14, the "first transmit signal" output from the amplifier 24, while outputting, to the down-converter 26, a received signal received from the antenna multiplexer 14.

The down-converter 26 down-converts a received signal output from the duplexer 25 and outputs the received signal at the resultant baseband frequency to the ADC 27.

The ADC 27 analogue-to-digital converts a received signal output from the down-converter 26 and outputs the resultant digital received signal to the processor 21.

In addition, as illustrated in FIG. 2, the RRH 13 includes a processor 31, a DAC 32, an up-converter 33, an amplifier 34, a duplexer 35, a down-converter 36, and an ADC 37.

The processor 31 includes, for example, a CPU, an FPGA, a DSP, or the like and executes various kinds of processing. Specifically, the processor 31 outputs, to the DAC 32, the "second transmit signal" received via the optical fiber L2 from the RRH 12. The processor 31 also acquires received data from a received signal that has been received from the ADC 37, and transfers the acquired received data via the optical fiber L2 to the RRH 12. Note that the functions of the processor 31 will be described in detail below.

The DAC 32 digital-to-analogue converts the "second transmit signal" output from the processor 31, and outputs the resultant analogue "second transmit signal" to the up-converter 33.

The up-converter 33 up-converts the "second transmit signal" output from the DAC 32 and outputs the "second transmit signal" at the resultant wireless frequency to the amplifier 34.

The amplifier 34 amplifies the "second transmit signal" output from the up-converter 33 and outputs the amplified "second transmit signal" to the duplexer 35.

The duplexer 35 outputs, to the antenna multiplexer 14, the "second transmit signal" output from the amplifier 34, while outputting, to the down-converter 36, a received signal received from the antenna multiplexer 14.

The down-converter 36 down-converts a received signal output from the duplexer 35 and outputs the received signal at the resultant baseband frequency to the ADC 37.

The ADC 37 analogue-to-digital converts a received signal output from the down-converter 36 and outputs the resultant digital received signal to the processor 31.

Figure 3:
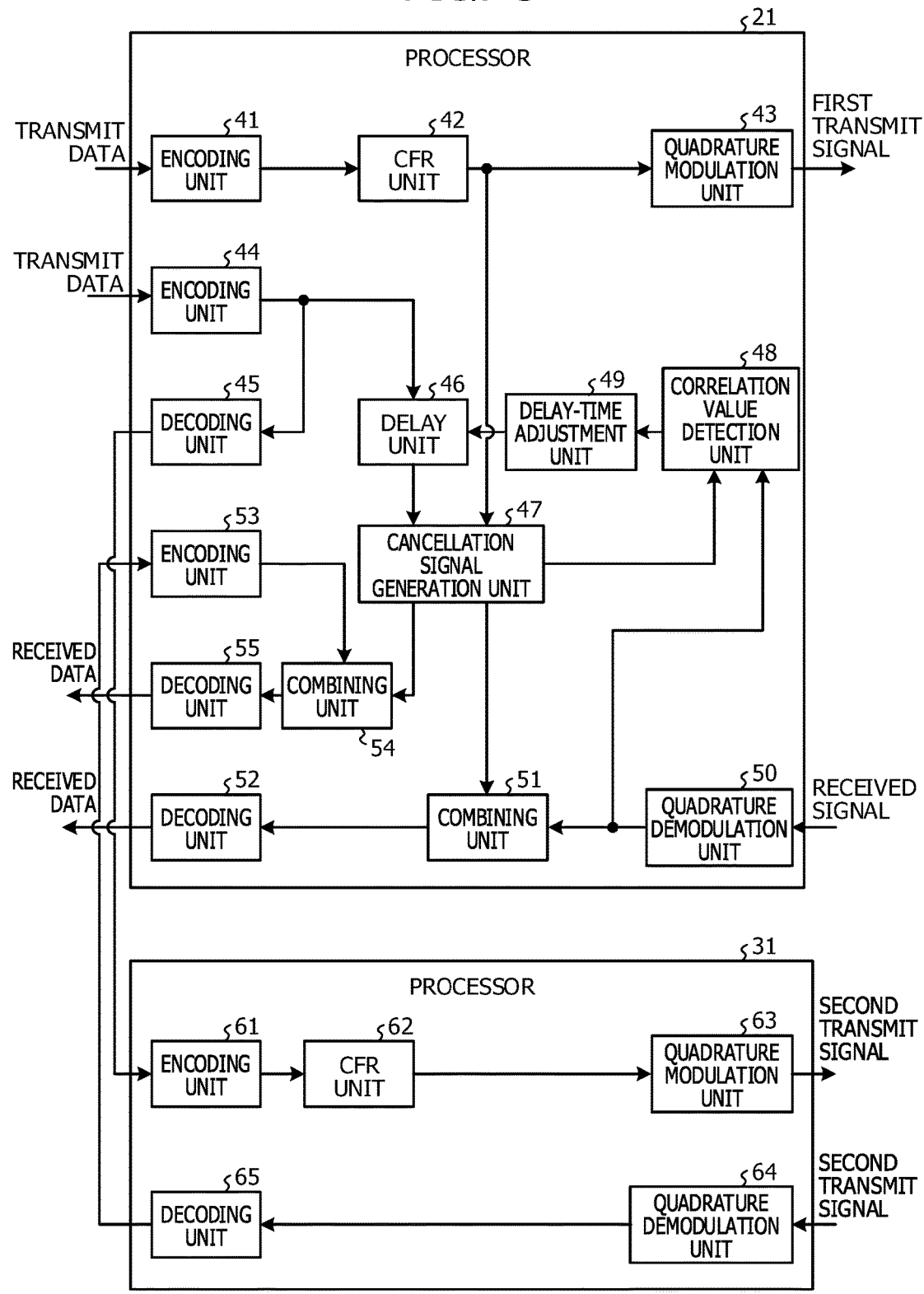
FIG. 3 is a block diagram illustrating functions of a processor of each RRH in the first embodiment.

FIG. 3 is a block diagram illustrating functions of the processors 21 and 31 of the RRHs 12 and 13 in the first embodiment. As illustrated in FIG. 3, the processor 21 includes an encoding unit 41, a crest factor reduction (CFR) unit 42, a quadrature modulation unit 43, an encoding unit 44, a decoding unit 45, a delay unit 46, a cancellation signal generation unit 47, a correlation value detection unit 48, and a delay-time adjustment unit 49. The processor 21 also includes a quadrature demodulation unit 50, a combining unit 51, a decoding unit 52, an encoding unit 53, a combining unit 54, and a decoding unit 55.

The encoding unit 41 encodes transmit data corresponding to the frequency band A received via the optical fiber L1 from the BBU 11 to generate the "first transmit signal". The encoding unit 41 then outputs the generated "first transmit signal" to the CFR unit 42.

The CFR unit 42 uses a given CFR threshold to suppress, among power levels of the "first transmit signal", a power level greater than or equal to the CFR threshold (hereinafter called "peak power"). The CFR unit 42 then outputs the "first transmit signal" with the suppressed peak power to the quadrature modulation unit 43 and the cancellation signal generation unit 47.

The quadrature modulation unit 43 quadrature modulates the "first transmit signal" and outputs the quadrature modulated "first transmit signal" to the DAC 22.

The encoding unit 44 encodes transmit data corresponding to the frequency band B received via the optical fiber L1 from the BBU 11 to generate the "second transmit signal". The encoding unit 44 then outputs the generated "second transmit signal" to the decoding unit 45 and the delay unit 46.

The decoding unit 45 decodes the "second transmit signal" output from the encoding unit 44 to acquire transmit data corresponding to the frequency band B. The decoding unit 45 then transfers the acquired transmit data corresponding to the frequency band B via the optical fiber L2 to the RRH 13.

The delay unit 46 delays the "second transmit signal" by a "delay time" representing a difference between the time for the "first transmit signal" to pass through the RRH 12 and the time for the "second transmit signal" to pass through the RRH 12, the optical fiber L2, and the RRH 13. For example, the delay unit 46 acquires the "delay time" measured in advance, such as at the time of designing, manufacturing, or the like of the RRH 12, from a memory in the RRH 12 or an external device, such as the BBU 11, and delays the "second transmit signal" by the acquired "delay time". The delay unit 46 also corrects (adjusts) the "delay time" based on an adjusted "delay time" value received from the delay-time adjustment unit 49.

Figure 4:
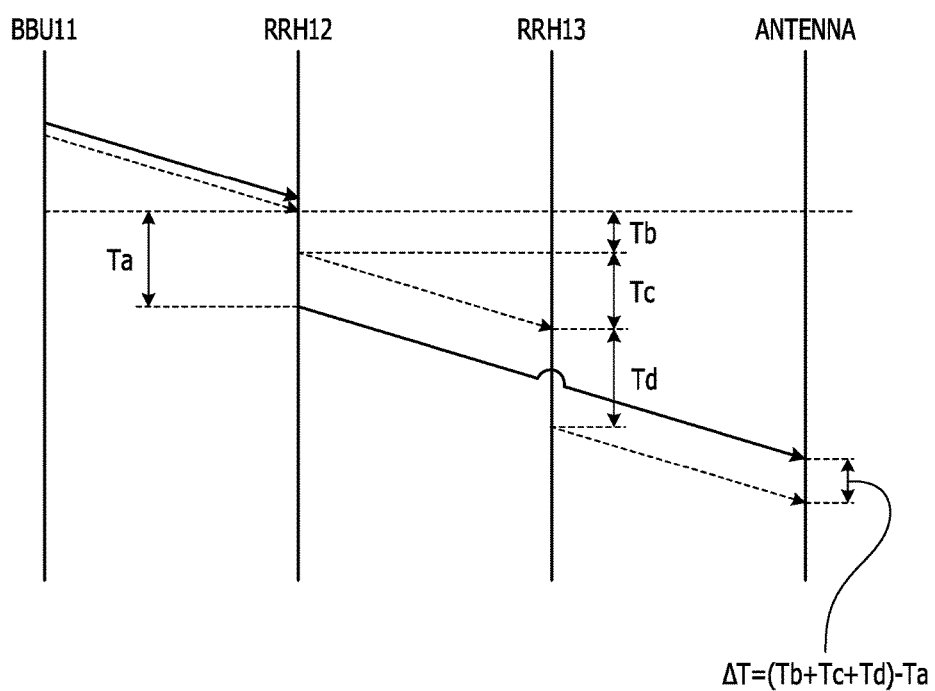
FIG. 4 is a diagram illustrating an example of a "delay time" in the first embodiment.

FIG. 4 is a diagram illustrating an example of the "delay time" in the first embodiment. In FIG. 4, a solid-line arrow indicates the "first transmit signal" and a broken-line arrow indicates the "second transmit signal". As illustrated in FIG. 4, the "first transmit signal" is output from the BBU 11, passes through the optical fiber L1 and the RRH 12, and arrives, via the antenna multiplexer 14, at an antenna. In contrast, the "second transmit signal" is output from the BBU 11, passes through the optical fiber L1, the RRH 12, the optical fiber L2, and the RRH 13, and arrives, via the antenna multiplexer 14, at the antenna. That is, the time at which the "second transmit signal" arrives at the antenna delays by the "delay time" mentioned above. Here, the time taken for the "first transmit signal" to pass through the RRH 12 after the "first transmit signal" has been input to the RRH 12 is assumed to be Ta, and the time taken for the "second transmit signal" to pass through the RRH 12 after the "second transmit signal" has been input to the RRH 12 is assumed to be Tb. In addition, the time taken for the "second transmit signal" to pass through the optical fiber L2 after the "second transmit signal" has been input to the optical fiber L2 is assumed to be Tc, and the time taken for the "second transmit signal" to pass through the RRH 13 after the "second transmit signal" has been input to the RRH 13 is assumed to be Td. In this case, the "delay time" $\Delta T$ is expressed as $\Delta T=(Tb+Tc+Td)-Ta$. Therefore, the "second transmit signal" that is delayed by the "delay time" $\Delta T$ by the delay unit 46 may be considered to correspond to the "second transmit signal" that has actually arrived at the antenna.

The cancellation signal generation unit 47 generates a cancellation signal for cancelling an intermodulation distortion, which is added to a received signal in the antennal multiplexer 14, based on the "first transmit signal" and the "second transmit signal" delayed by the "delay time" by the delay unit 46. For example, the cancellation signal generation unit 47 calculates a third-order distortion component by using a mathematical model that represents a third-order distortion component included in the frequency band of a received signal by a product of powers of the "first transmit signal" and the "second transmit signal" delayed by the "delay time" by the delay unit 46. The cancellation signal generation unit 47 then outputs the calculated three-order distortion component as a cancellation signal to the correlation value detection unit 48, the combining unit 51, and the combining unit 54.

The correlation value detection unit 48 detects a correlation value between a received signal output from the quadrature demodulation unit 50 (that is, a received signal that passes through the antenna multiplexer 14 and is input to the RRH 12) and a cancellation signal generated by the cancellation signal generation unit 47. That is, when a cancellation signal is generated to be equal to the "second transmit signal" delayed by an optimal "delay time", the cancellation signal matches an intermodulation distortion actually added to the received signal, and therefore the correlation value between the cancellation signal and the received signal is increased. Accordingly, it may be considered that the greater the correlation value detected by the correlation value detection unit 48, the higher the accuracy of the cancellation signal generated by the cancellation signal generation unit 47.

The delay-time adjustment unit 49 adjusts the "delay time" used for delaying the "second transmit signal" in the delay unit 46, based on a correlation value detected by the correlation value detection unit 48. Specifically, the delay-time adjustment unit 49 sequentially changes the "delay time" used for delaying the "second transmit signal" in the delay unit 46, acquires a correlation value from the correlation value detection unit 48 each time the "delay time" is changed, and adjusts the "delay time" so as to maximize the acquired correlation value.

Figure 5:
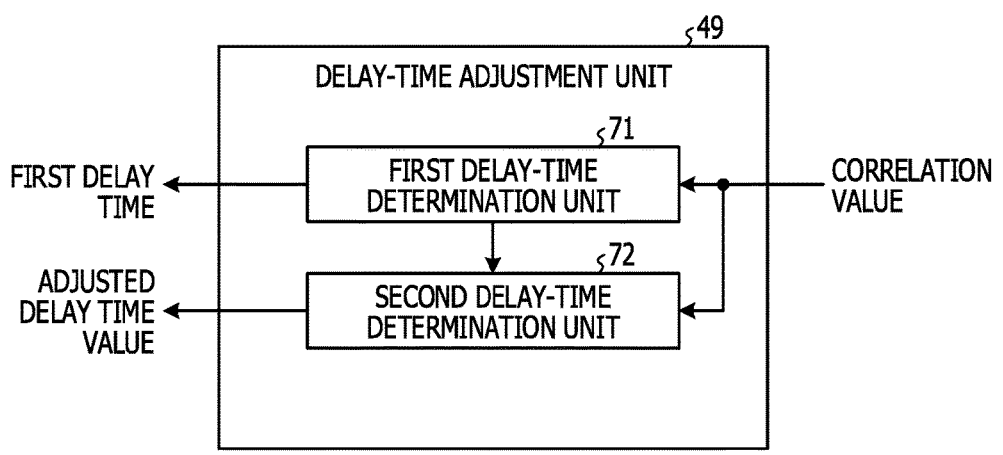
FIG. 5 is a block diagram illustrating an example of a delay-time adjustment unit in the first embodiment.

For example, the delay-time adjustment unit 49, as illustrated in FIG. 5, includes a first delay-time determination unit 71 and a second delay-time determination unit 72. FIG. 5 is a block diagram illustrating an example of the delay-time adjustment unit 49 in the first embodiment.

The first delay-time determination unit 71 sequentially changes, at a "first time interval" in the "first range", the "delay time" used for delaying the "second transmit signal" in the delay unit 46, and acquires a correlation value from the correlation value detection unit 48 each time the "delay time" is changed. For example, when the clock frequency of the processor 21 is 30.72 MHz, the "first time interval" is about 32 ns, which is obtained from the inverse of the clock frequency of the processor 21. In addition, assuming that the "delay time" is 6.05 µs at its maximum, the "first range" is a range of 32 ns to 6.05 µs, and the number of times the "delay time" is changed is 6.05 µs/32 ns=189. That is, 189 correlation values are acquired for 189 "delay times". Then, the first delay-time determination unit 71 determines, as a temporary "delay time", the "first delay time" with which the acquired correlation value is greatest.

The second delay-time determination unit 72 sequentially changes the "first delay time" at a "second time interval" in a "second range", and acquires a correlation value from the correlation value detection unit 48 each time the "first delay time" is changed. The "second range" is a range that includes the "first delay time" and is narrower than the "first range", and the "second time interval" is a time interval narrower than the "first time interval". When, for example, the clock frequency of the processor 21 is 30.72 MHz, the "second time interval" is about 0.5 ns, which is obtained from the inverse of 1/64 times the clock frequency of the processor 21. In addition, the "second range" is a range of the "first delay time"±0.05 μs, and the number of times the "first delay time" is changed is 0.1 μs/0.5 ns=200. That is, 200 correlation values are acquired for 200 "first delay times". The second delay-time determination unit 72 then determines the "first delay time" with which the acquired correlation value is greatest, as a "delay time" (that is, the adjusted "delay time" value) used for delaying the "second transmit signal" in the delay unit 46. The second delay-time determination unit 72 then outputs the determined adjusted "delay time" value to the delay unit 46.

With reference now to FIG. 3, description will be given. The quadrature demodulation unit 50 quadrature demodulates a received signal received from the ADC 27, and outputs the quadrature demodulated received signal to the correlation value detection unit 48 and the combining unit 51.

The combining unit 51 combines together a received signal to which an intermodulation distortion is added and that is output from the quadrature demodulation unit 50 (that is, a received signal that passes through the antenna multiplexer 14 and is input to the RRH 12) and a cancellation signal generated by the cancellation signal generation unit 47. That is, the combining unit 51 cancels an intermodulation distortion added to a received signal in the above "passage path" by combining the received signal with a cancellation signal.

The decoding unit 52 decodes the received signal, in which the intermodulation distortion is cancelled by the combining unit 51, to acquire received data, and transmits the acquired received data via the optical fiber L1 to the BBU 11.

The encoding unit 53 encodes the received data received via the optical fiber L2 from the RRH 13 to generate a received signal. The encoding unit 53 then outputs the generated received signal to the combining unit 54.

The combining unit 54 combines together the received signal to which an intermodulation distortion is added and that is output from the encoding unit 53 (that is, a received signal that passes through the antenna multiplexer 14 and is input to the RRH 12) and a cancellation signal generated by the cancellation signal generation unit 47. That is, the combining unit 54 cancels an intermodulation distortion added to a received signal in the above "passage path" by combining the received signal with a cancellation signal.

The decoding unit 55 decodes the received signal, in which the intermodulation distortion is cancelled by the combining unit 54, to acquire received data, and transmits the acquired received data via the optical fiber L1 to the BBU 11.

In addition, as illustrated in FIG. 3, the processor 31 includes an encoding unit 61, a CFR unit 62, a quadrature modulation unit 63, a quadrature demodulation unit 64, and a decoding unit 65.

The encoding unit 61 encodes transmit data corresponding to the frequency band B received via the optical fiber L2 from the RRH 12 and generates the "second transmit signal". The encoding unit 61 then outputs the generated "second transmit signal" to the CFR unit 62.

The CFR unit 62 suppresses the peak power of the "second transmit signal" by using a given CFR threshold. The CFR unit 62 outputs the "second transmit signal" with the suppressed peak power to the quadrature modulation unit 63.

The quadrature modulation unit 63 quadrature modulates the "second transmit signal" and outputs the quadrature modulated "second transmit signal" to the DAC 32.

The quadrature demodulation unit 64 quadrature demodulates a received signal received from the ADC 37 and outputs the quadrature modulated received signal to the decoding unit 65.

The decoding unit 65 decodes the received signal output from the quadrature demodulation unit 64 to acquire received data, and transfers the acquired received data via the optical fiber L2 to the RRH 12.

Figure 6:
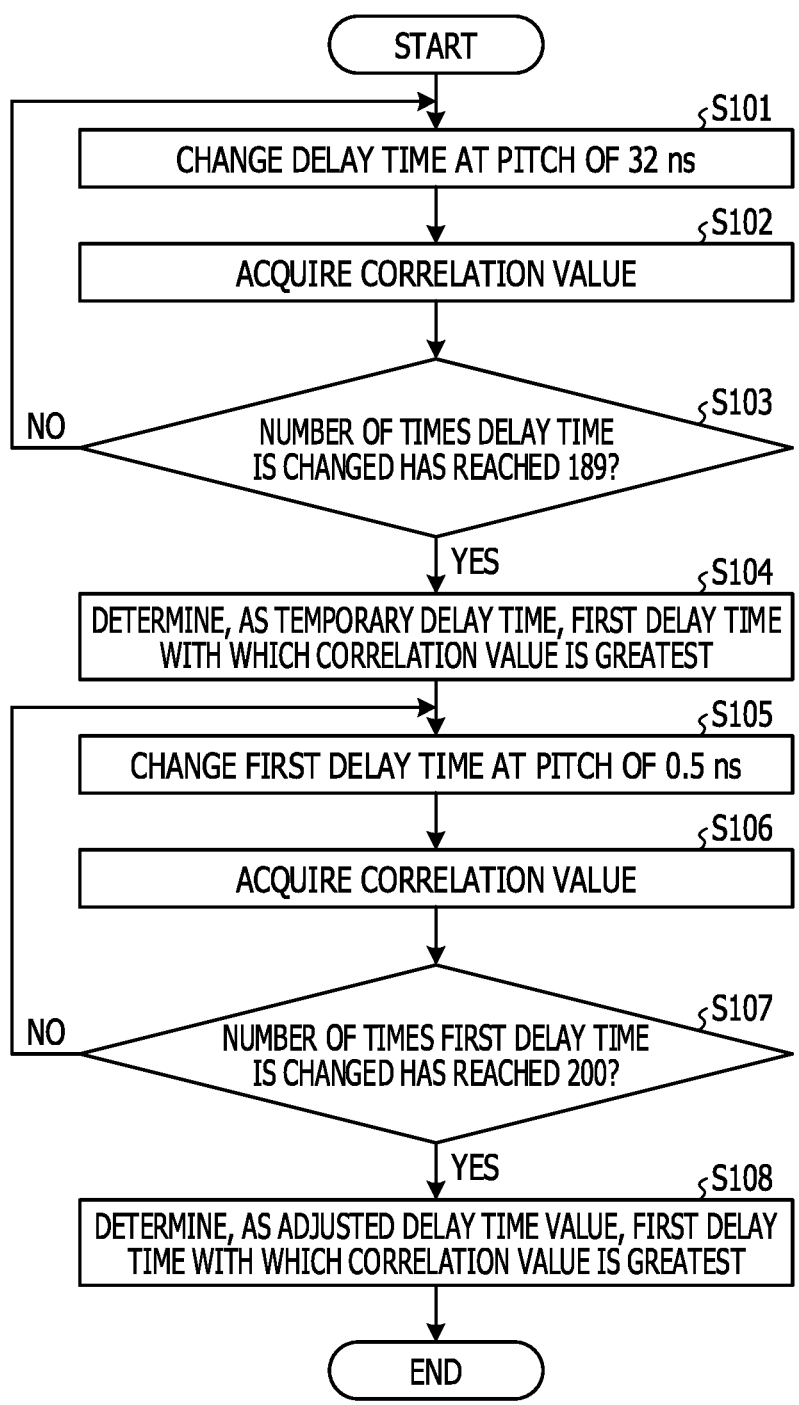
FIG. 6 is a flowchart illustrating an example of processing operations of an RRH according to the first embodiment.
Figure 7:
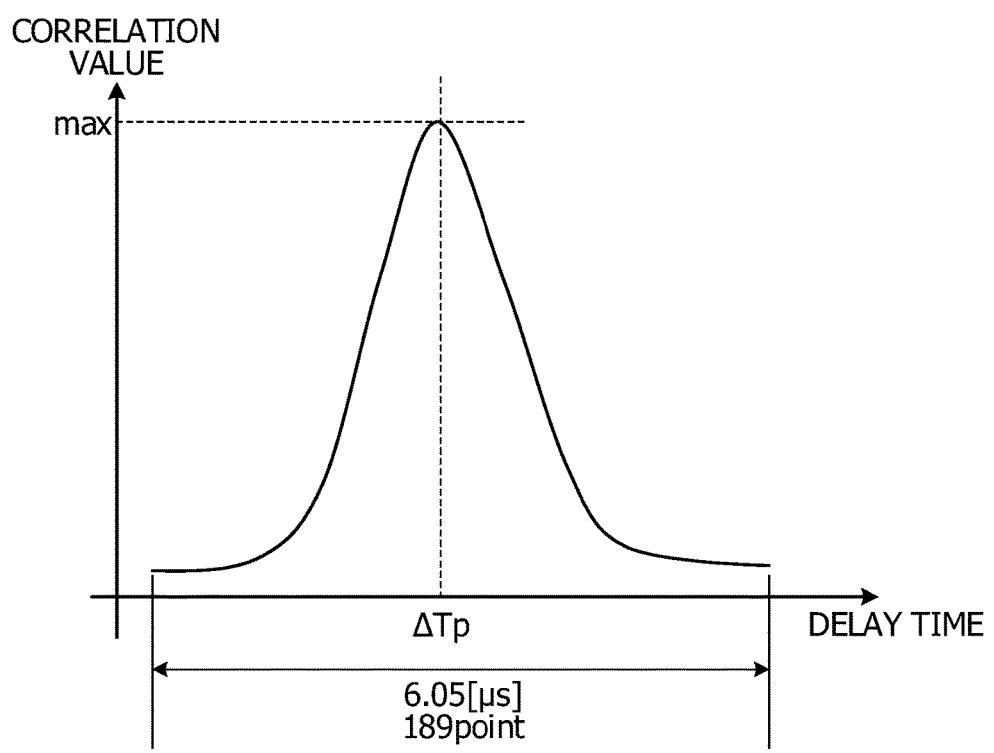
FIG. 7 is a diagram serving to illustrate processing operations of an RRH according to the first embodiment.
Figure 8:
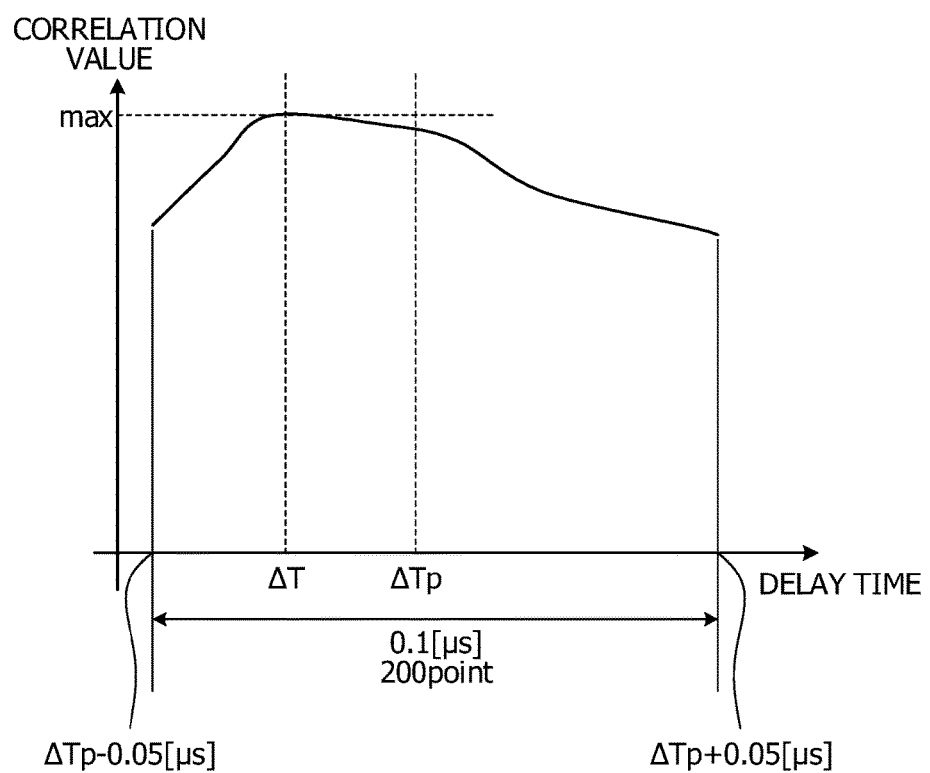
FIG. 8 is a diagram serving to illustrate processing operations of an RRH according to the first embodiment.

Next, an example of processing operations of the RRH 12 configured as described above will be described. FIG. 6 is a flowchart illustrating an example of processing operations of the RRH 12 according to the first embodiment. In addition, FIG. 7 and FIG. 8 are diagrams serving to illustrate processing operations of the RRH 12 according to the first embodiment.

The first delay-time determination unit 71 of the delay-time adjustment unit 49 changes the "delay time" used for delaying the "second transmission time" in the delay unit 46 at a pitch of 32 ns in a range of 32 ns to 6.05 μs (step S101).

The first delay-time determination unit 71 acquires a correlation value from the correlation value detection unit 48 (step S102). The correlation value acquired by the first delay-time determination unit 71 is stored in association with the "delay time" changed in step S101 in a predetermined memory.

If the number of times the "delay time" is changed has not reached 189, that is, if 189 correlation values are not acquired for 189 "delay times" (No in step S103), the first delay-time determination unit 71 returns the process to step S101.

Otherwise, if the number of times the "delay time" is changed has reached 189, that is, if 189 correlation values are acquired for 189 "delay times" (Yes in step S103), the first delay-time determination unit 71 performs the following processing. That is, the first delay-time determination unit 71 determines, as a temporary "delay time", the "first delay time" with which the acquired correlation value is greatest (step S104). For example, as illustrated in FIG. 7, the first delay-time determination unit 71 determines, as a temporary "delay time", among 189 "delay times" belonging to a range of 32 ns to 6.05 μs, a "first delay time" ΔTp corresponding to the greatest of the correlation values.

The second delay-time determination unit 72 changes the "first delay time" at a pitch of 0.5 ns in a range of the "first delay time"±0.05 μs (step S105).

The second delay-time determination unit 72 acquires a correlation value from the correlation value detection unit 48 (step S106). The correlation value acquired by the second delay-time determination unit 72 is stored in association with the "first delay time" changed in step S105 in a predetermined memory.

If the number of times the "first delay time" is changed has not reached 200, that is, if 200 correlation values are not acquired for 200 "first delay times" (No in step S107), the second delay-time determination unit 72 returns the process to step S105.

Otherwise, if the number of times the "first delay time" is changed has reached 200, that is, if 200 correlation values are acquired for 200 "first delay times" (Yes in step S107), the second delay-time determination unit 72 performs the following processing. That is, the second delay-time determination unit 72 determines the "first delay time" with which the acquired correlation value is greatest, as a "delay time" used for delaying the "second transmit signal" in the delay unit 46 (that is, an adjusted "delay time" value) (step S108). For example, as illustrated in FIG. 8, the second delay-time determination unit 72 determines, as an adjusted "delay time" value of the delay unit 46, among 200 "delay times" belonging to a range of the "first delay time" ΔTp±0.05 μs, the "first delay time" ΔT corresponding to the greatest of the correlation values.

As described above, according to the first embodiment, the second transmit signal is delayed by a delay time between the first and second transmit signals transmitted from the cascaded RHHs 12 and 13, and a cancellation signal for an intermodulation distortion is generated based on the first transmit signal and the delayed second transmit signal. Therefore, a gap between a cancellation signal and an actual intermodulation distortion, caused by a delay time between the first transmit signal and the second transmit signal transmitted from the cascaded RHHs 12 and 13 may be alleviated. In other words, a decrease in the accuracy of a cancellation signal for an intermodulation distortion caused by a delay time between the first and second transmit signals transmitted from the cascaded RHHs 12 and 13 may be reduced.

In addition, according to the first embodiment, the delay time used for delaying the second transmit signal is sequentially changed, a correlation value between a received signal and a cancellation signal is acquired each time the delay time is changed, and the delay time is adjusted so as to maximize the acquired correlation value. Therefore, the delay time between the first and second transmit signals transmitted from the cascaded RHHs 12 and 13 may be suitably adjusted, and thus the accuracy of a cancellation signal may be improved.

Second Embodiment

The features of a second embodiment are that a cancellation signal is generated based on a first transmit signal and a second transmit signal that is delayed by a delay time and whose peak power is suppressed, and a threshold used for suppressing the peak power is adjusted based on a correlation value between a received signal and the cancellation signal.

Figure 9:
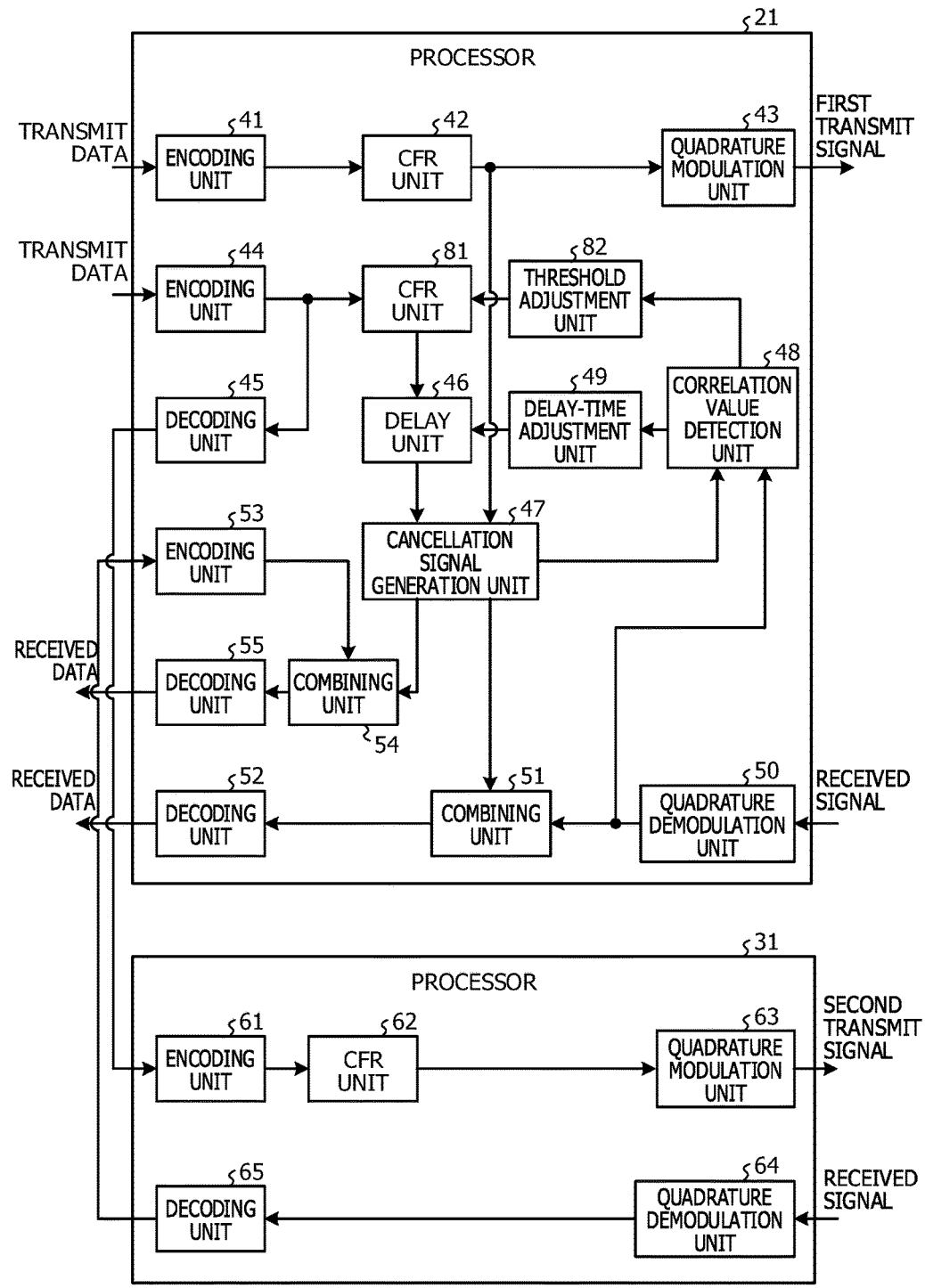
FIG. 9 is a block diagram illustrating functions of a processor of each RRH in a second embodiment.

The configuration of the base station system 10 according to the second embodiment is similar to that according to the first embodiment (FIG. 1), and therefore description thereof is omitted. The configuration of each of the RRHs 12 and 13 in the second embodiment is similar to that in the first embodiment (FIG. 2), and therefore description thereof is omitted. In the second embodiment, the functions of the processor 21 of the RRH 12 are different from those in the first embodiment. FIG. 9 is a block diagram illustrating the functions of the processors 21 and 31 of the RRHs 12 and 13 in the second embodiment. In FIG. 9, the same portions as in FIG. 3 are denoted by the same reference numerals and description thereof is omitted. As illustrated in FIG. 9, the processor 21 includes a CFR unit 81 and a threshold adjustment unit 82.

The CFR unit 81 uses a CFR threshold set therefor to suppress peak power of the "second transmit signal" output from the encoding unit 44. Here, the initial value of the CFR threshold set for the CFR unit 81 is, for example, a CFR threshold used for suppressing peak power of the "second transmit signal" in the CFR unit 62 of the RRH 13. The CFR unit 81 outputs the "second transmit signal" with the suppressed peak power to the delay unit 46. That is, the cancellation signal of the second embodiment is generated by the cancellation signal generation unit 47 based on the "first transmit signal" and the "second transmit signal" that is delayed by the "delay time" by the delay unit 46 and whose peak power is suppressed by the CFR unit 81. In addition, the CFR unit 81 corrects (adjusts) a CFR threshold set therefor based on an adjusted CFR threshold value received from the threshold adjustment unit 82.

The threshold adjustment unit 82 adjusts a CFR threshold set for the CFR unit 81 based on a correlation value detected by the correlation value detection unit 48. Specifically, the threshold value adjustment unit 82 sequentially changes the CFR threshold set for the CFR unit 81, acquires a correlation value from the correlation value detection unit 48 each time the CFR threshold is changed, and adjusts the CFR threshold so as to maximize the acquired correlation value.

For example, the threshold adjustment unit 82 sequentially changes the CFR threshold set for the CFR unit 81 at a "predetermined threshold interval" in a "predetermined threshold range", and acquires a correlation value from the correlation value detection unit 48 each time the CFR threshold is changed. The "predetermined threshold interval" is, for example, 0.1 dB. In addition, the "predetermined threshold range" is, for example, a range of 5 to 15 dB. When the CFR threshold set for the CFR unit 81 is sequentially changed at the pitch of 0.1 dB in the range of 5 to 15 dB, the number of times the CFR threshold is changed is 10 dB/0.1 dB=100. That is, 100 correlation values are acquired for 100 CFR thresholds. The threshold adjustment unit 82 then determines a CFR threshold with which the acquired correlation value is greatest, as a CFR threshold set for the CFR unit 81 (that is, an adjusted CFR threshold value). The threshold adjustment unit 82 then outputs the determined adjusted CFR threshold value to the CFR unit 81.

Figure 10:
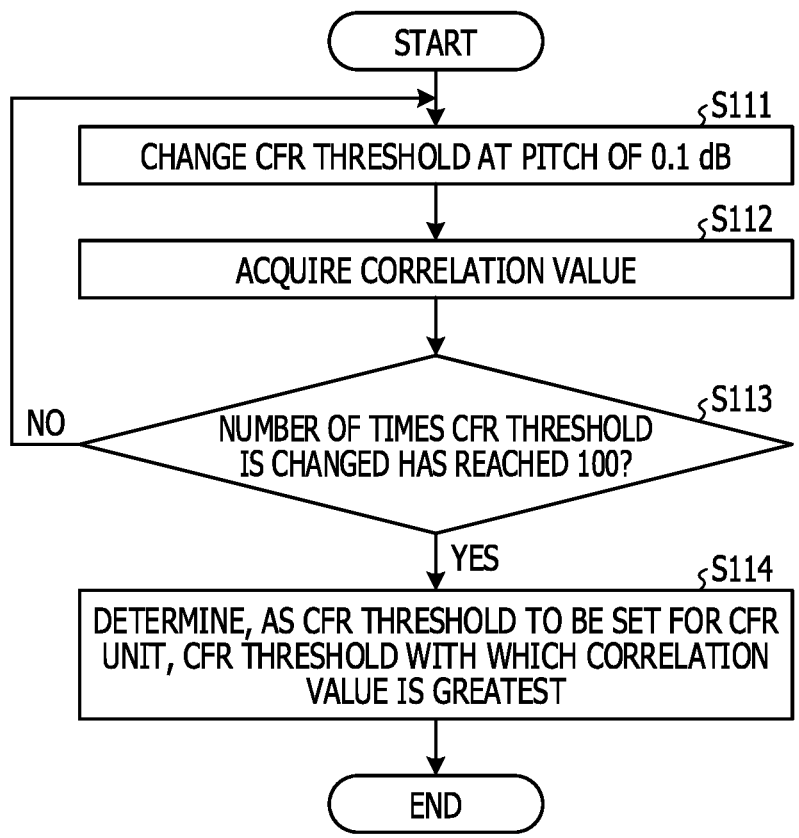
FIG. 10 is a flowchart illustrating an example of processing operations of an RRH according to the second embodiment.
Figure 11:
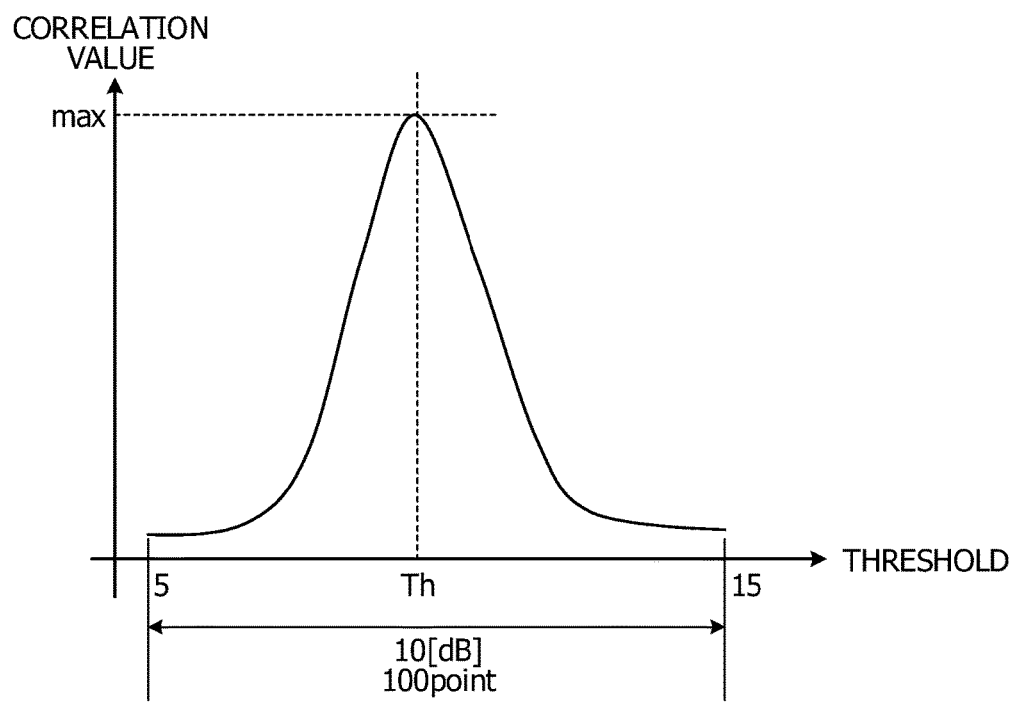
FIG. 11 is a diagram serving to illustrate processing operations of an RRH according to the second embodiment.

Next, an example of processing operations of the RRH 12 configured as described above will be described. FIG. 10 is a flowchart illustrating an example of processing operations of the RRH 12 according to the second embodiment. In addition, FIG. 11 is a diagram serving to illustrate processing operations of the RRH 12 according to the second embodiment.

The threshold adjustment unit 82 changes the CFR threshold to be set for the CFR unit 81 at a pitch of 0.1 dB in a range of 5 to 15 dB (step S111).

The threshold adjustment unit 82 acquires a correlation value from the correlation value detection unit 48 (step S112). The correlation value acquired by the threshold adjustment unit 82 is stored in association with the CFR threshold changed in step S111 in a predetermined memory.

If the number of times the CFR threshold is changed has not reached 100, that is, if 100 correlation values are not acquired for 100 CFR thresholds (No in step S113), the threshold adjustment unit 82 returns the process to step S111.

Otherwise, if the number of times the CFR threshold is changed has reached 100, that is, if 100 correlation values are acquired for 100 CFR thresholds (Yes in step S113), the threshold adjustment unit 82 performs the following processing. That is, the threshold adjustment unit 82 determines a CFR threshold with which an acquired correlation value is greatest, as a CFR threshold to be set for the CFR unit 81 (an adjusted CFR threshold value) (step S114). For example, as illustrated in FIG. 11, the threshold adjustment unit 82 determines, as an adjusted CFR threshold value, among 100 CFR thresholds belonging to the range of 5 to 15 dB, a CFR threshold Th corresponding to the greatest of the correlation values.

As described above, according to the second embodiment, a cancellation signal is generated based on the first transmit signal and the second transmit signal that is delayed by a delay time and whose peak power is suppressed, and a CFR threshold used for suppression of the peak power is adjusted based on a correlation value between a received signal and the cancellation signal. Therefore, a gap between the cancellation signal and an actual intermodulation distortion caused by a difference between a CFR threshold used for suppression of a peak power of the second transmit signal in the RRH 12 and a CFR threshold used for suppression of peak power of the second transmit signal in the RRH 13. As a result, a decrease in the accuracy of a cancellation signal may be more reduced.

Third Embodiment

The features of a third embodiment are that a cancellation signal is generated based on a first transmit signal and a second transmit signal that is delayed by a delay time and whose average amplitude is adjusted, and gain used for adjustment of the average amplitude is adjusted based on a correlation value between a received signal and the cancellation signal.

Figure 12:
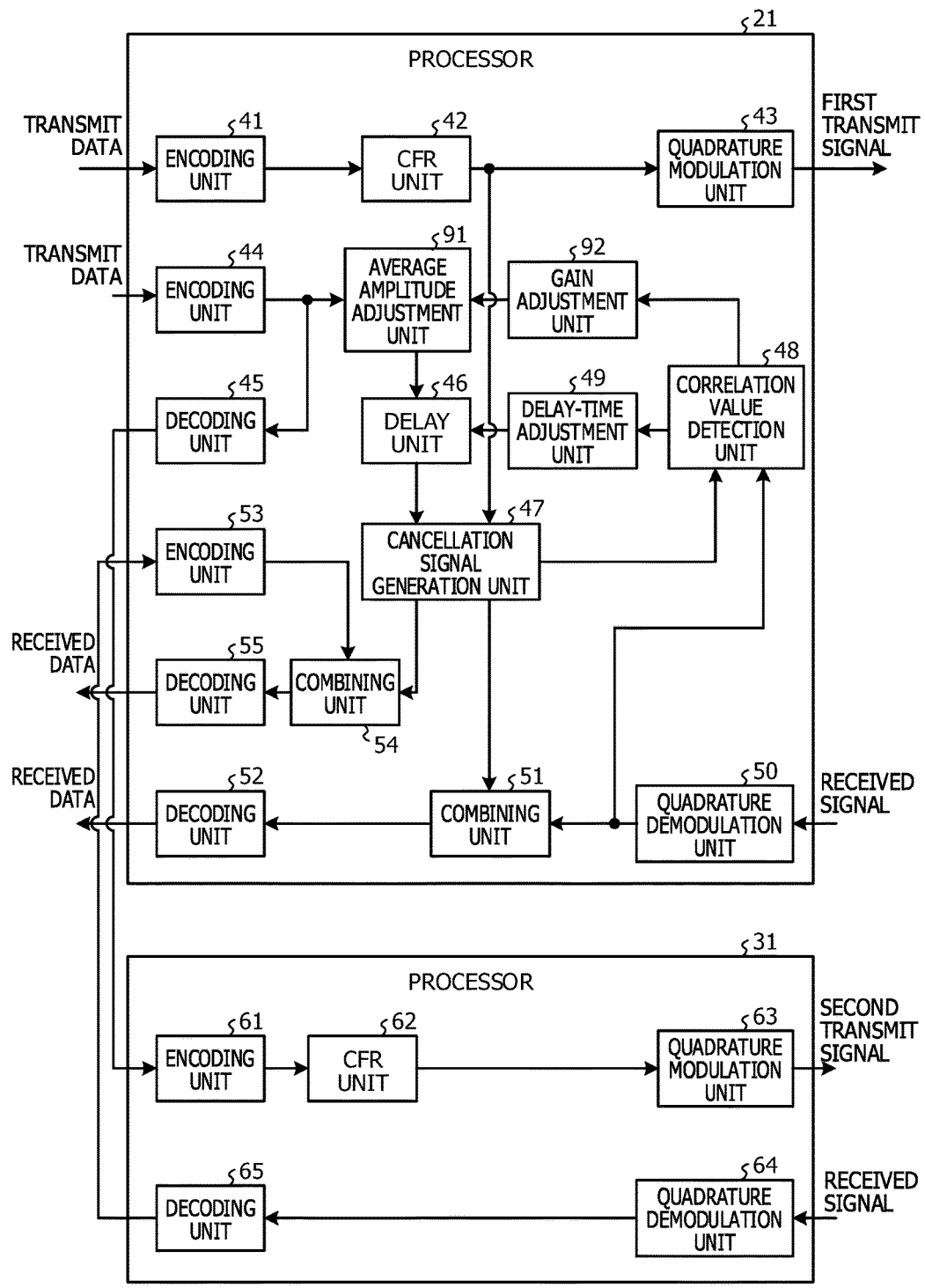
FIG. 12 is a block diagram illustrating functions of a processor of each RRH in a third embodiment.

The configuration of the base station system 10 according to the third embodiment is similar to that according to the first embodiment (FIG. 1), and therefore description thereof is omitted. The configuration of each of the RRHs 12 and 13 in the third embodiment is similar to that in the first embodiment (FIG. 2), and therefore description thereof is omitted. In the third embodiment, the functions of the processor 21 of the RRH 12 differ from those in the first embodiment. FIG. 12 is a block diagram illustrating functions of the processors 21 and 31 of the RRHs 12 and 13 in the third embodiment. In FIG. 12, the same portions as in FIG. 3 are denoted by the same reference numerals and description thereof is omitted. As illustrated in FIG. 12, the processor 21 includes an average amplitude adjustment unit 91 and a gain adjustment unit 92.

The average amplitude adjustment unit 91 uses gain set therefor to adjust the average amplitude of the "second transmit signal" output from the encoding unit 44. Here, the initial value of the gain set for the average amplitude adjustment unit 91 is, for example, a value calculated by measuring, in advance, the average amplitude of the "second transmit signal" that has actually passed through the RRH 13 and inversing the sign of the obtained measured value. Then, the average amplitude adjustment unit 91 outputs the "second transmit signal" with the adjusted average amplitude to the delay unit 46. That is, the cancellation signal in the third embodiment is generated by the cancellation signal generation unit 47 based on the "first transmit signal" and the "second transmit signal" that is delayed by the "delay time" by the delay unit 46 and whose average amplitude is adjusted by the average amplitude adjustment unit 91. In addition, the average amplitude adjustment unit 91 adjusts the gain set therefor based on an adjusted gain value received from the gain adjustment unit 92.

The gain adjustment unit 92 adjusts gain set for the average amplitude adjustment unit 91, based on a correlation value detected by the correlation value detection unit 48. Specifically, the gain adjustment unit 92 sequentially changes the gain set for the average amplitude adjustment unit 91, acquires a correlation value from the correlation value detection unit 48 each time the gain is changed, and adjusts the gain so as to maximize the acquired correlation value.

For example, the gain adjustment unit 92 sequentially changes the gain set for the average amplitude adjustment unit 91, at a "predetermined gain interval" in a "predetermined gain range", and acquires a correlation value from the correlation value detection unit 48 each time the gain is changed. The "predetermined gain interval" is, for example, 0.1 dB. In addition, the "predetermined gain range" is, for example, a range from −10 to 10 dB. When the gain set for the average amplitude adjustment unit 91 is sequentially changed at the pitch of 0.1 dB in the range of −10 to 10 dB, the number of times the gain is changed is 20 dB/0.1 dB=200. That is, 200 correlation values are acquired for 200 gain values. The gain adjustment unit 92 then determines gain with which the acquired correlation value is greatest, as gain set for the average amplitude adjustment unit 91 (that is, an adjusted gain value). The gain adjustment unit 92 then outputs the determined adjusted gain value to the average amplitude adjustment unit 91.

Figure 13:
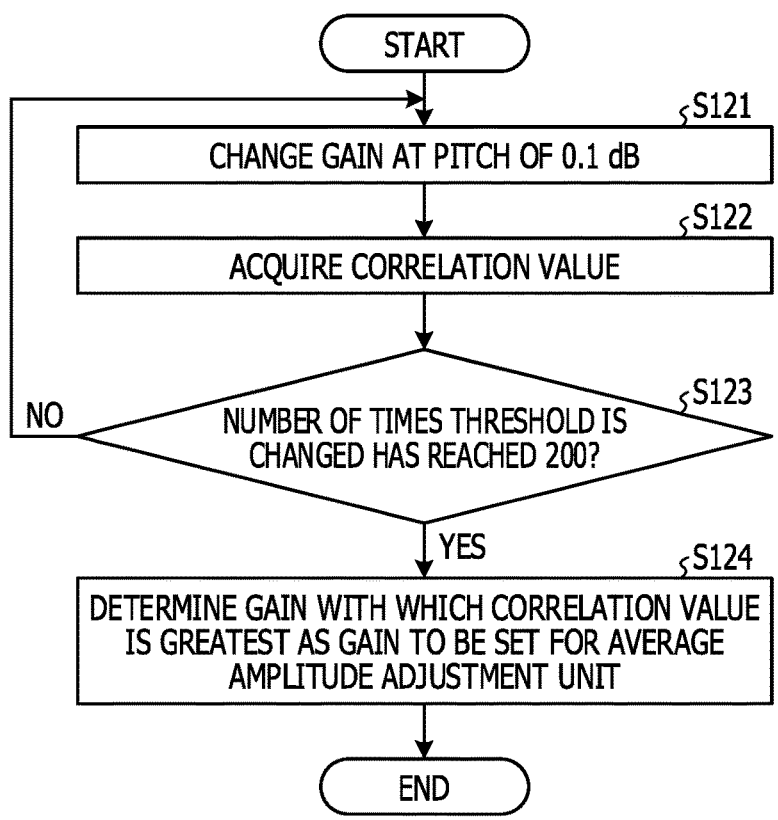
FIG. 13 is a flowchart illustrating an example of processing operations of an RRH according to the third embodiment.
Figure 14:
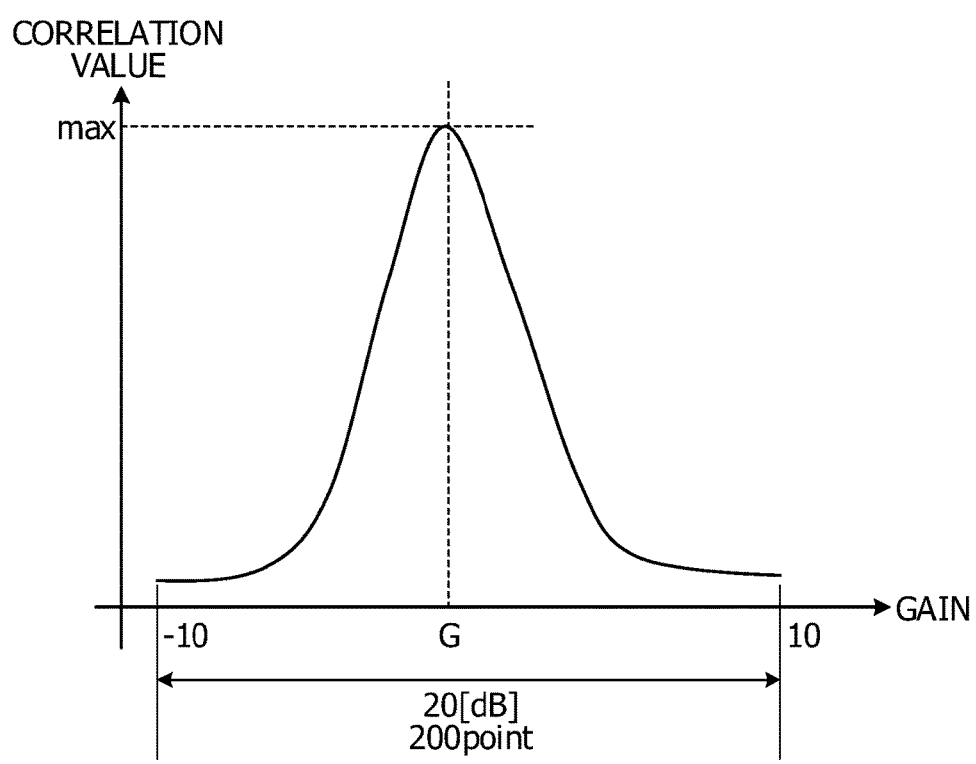
FIG. 14 is a diagram serving to illustrate processing operations of an RRH according to the third embodiment.

Next, an example of processing operations of the RRH 12 configured as described above will be described. FIG. 13 is a flowchart illustrating an example of processing operations of the RRH 12 according to a third embodiment. In addition, FIG. 14 is a diagram serving to illustrate processing operations of the RRH 12 according to the third embodiment.

The gain adjustment unit 92 changes gain to be set for the average amplitude adjustment unit 91 at a pitch of 0.1 dB in a range of −10 to 10 dB (step S121).

The gain adjustment unit 92 acquires a correlation value from the correlation value detection unit 48 (step S122). The correlation value acquired by the gain adjustment unit 92 is stored in association with the gain changed in step S121 in a predetermined memory.

If the number of times gain is changed has not reached 200, that is, if 200 correlation values are not acquired for 200 gain values (No in step S123), the gain adjustment unit 92 returns the process to step S121.

Otherwise, if the number of times gain is changed has reached 200, that is, if 200 correlation values are acquired for 200 gain values (Yes in step S123), the gain adjustment unit 92 performs the following processing. That is, the gain adjustment unit 92 determines gain with which the acquired correlation value is greatest, as gain to be set for the average amplitude adjustment unit 91 (that is, an adjusted gain value) (step S124). For example, as illustrated in FIG. 14, the gain adjustment unit 92 determines, as an adjusted gain value, among 200 gain values belonging to the range of −10 to 10 dB, gain G corresponding to the greatest of correlation values.

As described above, according to the third embodiment, a cancellation signal is generated based on the first transmit signal and the second transmit signal that is delayed by a delay time and whose average amplitude is adjusted, and gain used for adjustment of the average amplitude is adjusted based on a correlation value between a received signal and the cancellation signal. Therefore, a gap between a cancellation signal and an actual intermodulation distortion caused by a difference between gain used for adjustment of an average amplitude of the "second transmit signal" in the RRH 12 and the average amplitude of the "second transmit signal" that has actually passed through the RRH 13 may be alleviated. As a result, a decrease in the accuracy of a cancellation signal may be reduced.

Other Embodiments

Figure 15:
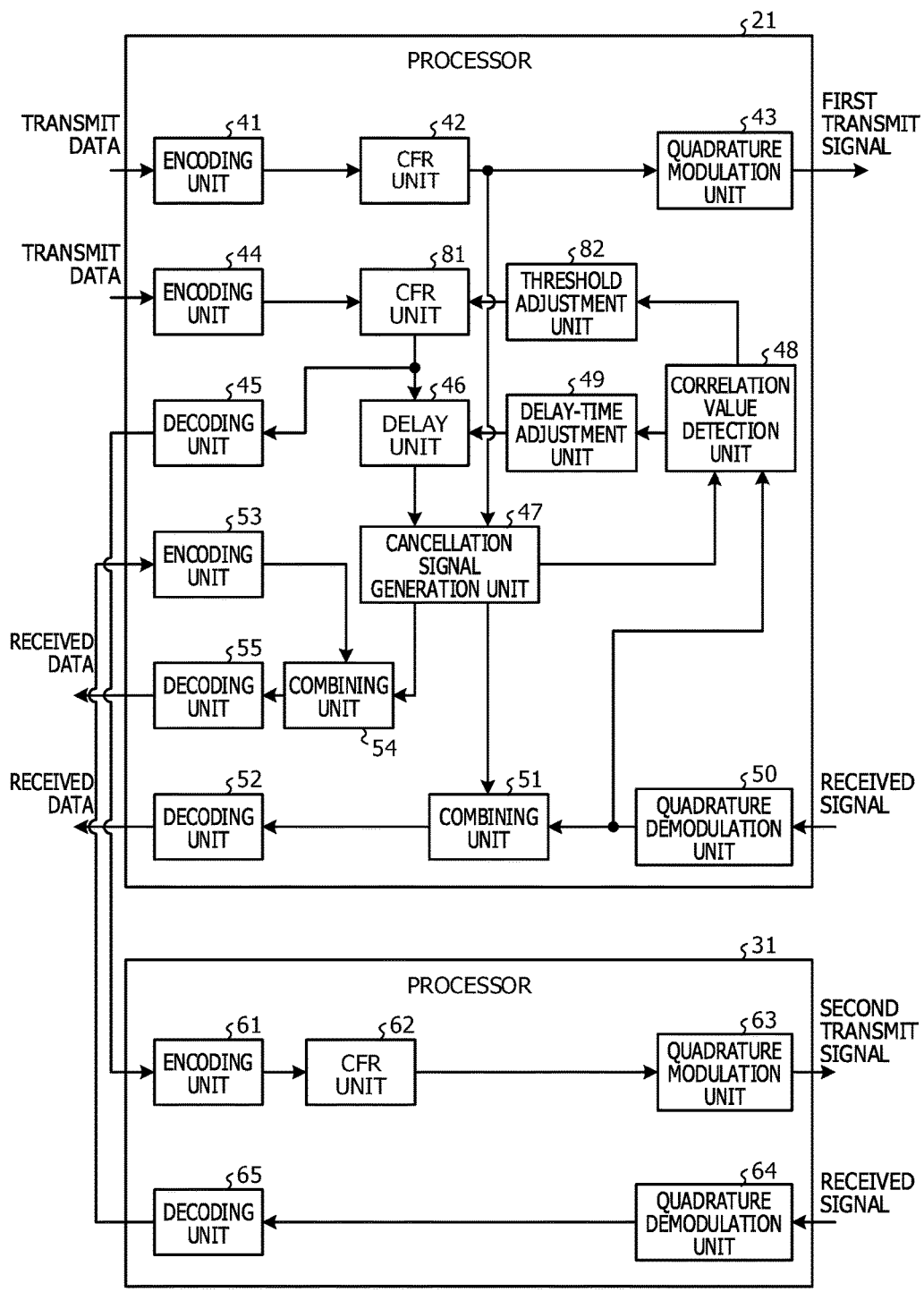
FIG. 15 is a block diagram illustrating functions of a processor of each RRH in a modification of the second embodiment.

[1] Although, in the second embodiment, an example in which the CFR unit 81 outputs the "second transmit signal" with the suppressed peak power to the delay unit 46 has been described, the disclosed techniques are not limited to this. For example, as illustrated in FIG. 15, the CFR unit 81 may output the "second transmit signal" with the suppressed peak power to the delay unit 46 and the decoding unit 45. In this case, the decoding unit 45 decodes the "second transmit signal" output from the CFR unit 81 to acquire transmit data corresponding to the frequency band B. The decoding unit 45 then transfers the acquired transmit data corresponding to the frequency band B via the optical fiber L2 to the RRH 13. Note that FIG. 15 is a block diagram illustrating the functions of the processors 21 and 31 of the RRHs 12 and 13 in a modification of the second embodiment.

Figure 16:
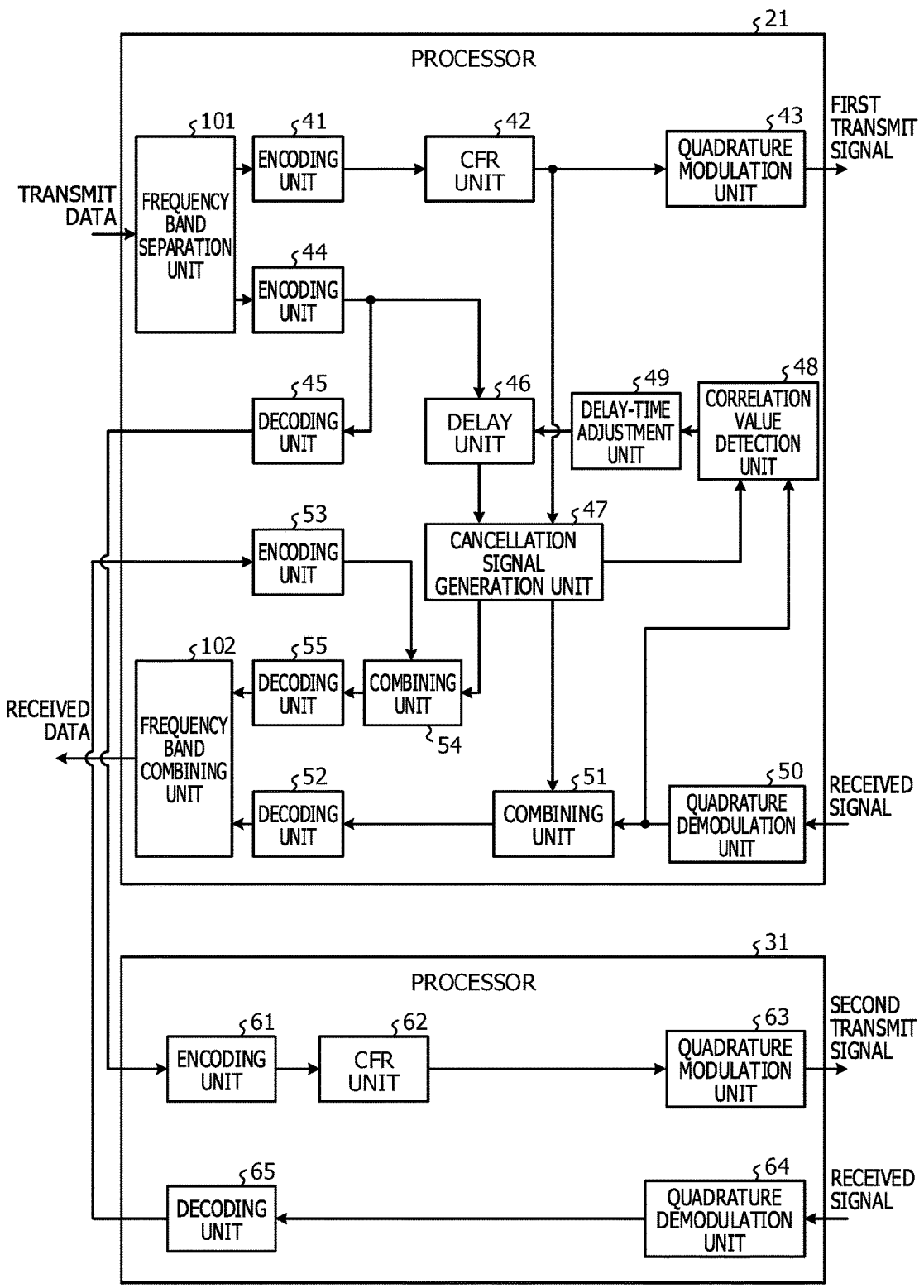
FIG. 16 is a block diagram illustrating functions of a processor of each RRH in a modification of the first embodiment.

[2] Although, in each of the foregoing embodiments, an example in which the BBU 11 individually transmits transmit data corresponding to the frequency band A and transmit data corresponding to the frequency band B via the optical fiber L1 to the RRH 12 has been described, the disclosed techniques are not limited to this. The BBU 11 may transmit single transmit data in which the transmit data corresponding to the frequency band A and the transmit data corresponding to the frequency band B are combined, via the optical fiber L1 to the RRH 12. In this case, as illustrated in FIG. 16, the processor 21 includes a frequency band separation unit 101 and a frequency band combining unit 102. FIG. 16 is a block diagram illustrating functions of the processors 21 and 31 of the RRHs 12 and 13 in a modification of the first embodiment.

The frequency band separation unit 101 extracts transmit data corresponding to the frequency band A and transmit data corresponding to the frequency band B that are included in single transmit data received via the optical fiber L1 from the BBU 11. The frequency band separation unit 101 then outputs transmit data corresponding to the frequency band A to the encoding unit 41 and outputs transmit data corresponding to the frequency band B to the encoding unit 44.

The frequency band combining unit 102 combines together received data output from the decoding unit 52 and received data output from the decoding unit 55 to generate single received data, and outputs the generated single received data via the optical fiber L1 to the BBU 11.

[3] The foregoing embodiments may be suitably combined. For example, the second and third embodiments may be combined such that a cancellation signal is generated based on a first transmit signal and a second transmit signal that is delayed by a delay time, whose peak power is suppressed, and whose average amplitude is adjusted.

[4] Although, in each of the foregoing embodiments, an example in which the RRH 12 is configured as a single apparatus has been described, the disclosed techniques are not limited to this. For example, the RRH 12 may be configured of two separate devices. In such a case, for example, the delay unit 46, the cancellation signal generation unit 47, and the combining units 51 and 54 are arranged in one device of the two separate devices, and functional units other than the delay unit 46, the cancellation signal generation unit 47, and the combining units 51 and 54 are arranged in the other device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless apparatus configured to be cascaded to another wireless apparatus through a transmission path and to be coupled to an antenna multiplexer, the another wireless apparatus being coupled to the antenna multiplexer, the wireless apparatus comprising:
   a memory; and
   a processor coupled to the memory and configured to:
      specify a first time length for a first transmission signal having a first frequency band to pass through the wireless apparatus;
      specify a second time length for a second transmission signal having a second frequency band to pass through the wireless apparatus, the transmission path, and the another wireless apparatus;
      specify a difference between the first time length and the second time length;
   delay the second transmission signal by the specified difference;
   generate, based on the first transmission signal and the delayed second transmission signal, a cancellation signal for an intermodulation distortion that occurs in a received signal received by the antenna multiplexer due to intermodulation between the first transmission signal and the second transmission signal in the antenna multiplexer; and
   combine the cancellation signal with the received signal.

2. The wireless apparatus according to claim 1, wherein the second frequency band is different from the first frequency band.

3. The wireless apparatus according to claim 2, wherein the processor is configured to:
   detect a correlation value between the received signal and the cancellation signal;
   based on the correlation value, sequentially change a delay amount by which the second transmission signal is delayed;
   specify the correlation value in accordance with the delay amount; and
   specify the delay amount so as to maximize the specified correlation value.

4. The wireless apparatus according to claim 3, wherein the processor is configured to:
   sequentially change the delay amount at a first time interval in a first range;
   specify the correlation value in accordance with a change in the delay amount;
   specify a first delay amount with which the specified correlation value is greatest;
   sequentially change the first delay amount at a second time interval narrower than the first time interval in a second range including the first delay amount and being narrower than the first range;
   specify the correlation value in accordance with a change in the first delay amount; and
   specify the first delay amount with which the specified correlation value is greatest.

5. The wireless apparatus according to claim 3, wherein the processor is configured to:
when power of the second transmission signal exceeds a threshold, suppress the power;
adjust the threshold based on the correlation value;
generate the cancellation signal based on the first transmission signal, the delayed second transmission signal and the suppressed power;
specify the correlation value in accordance with the threshold; and
specify the threshold so as to maximize the specified correlation value.

6. The wireless apparatus according to claim 3, wherein the processor is configured to:
adjust an average amplitude of the second transmission signal;
set an adjustment amount of the average amplitude based on the correlation value;
generate the cancellation signal based on the first transmission signal and the second transmission signal that is delayed and the average amplitude of which is adjusted;
specify the correlation value in accordance with the adjustment amount; and
set the adjustment amount so as to maximize the specified correlation value.

7. A method executed by a wireless apparatus configured to be cascaded to another wireless apparatus through a transmission path and to be coupled to an antenna multiplexer, the another wireless apparatus being coupled to the antenna multiplexer, the method comprising:
specifying a first time length for a first transmission signal having a first frequency band to pass through the wireless apparatus;
specifying a second time length for a second transmission signal having a second frequency band to pass through the wireless apparatus, the transmission path, and the another wireless apparatus;
specifying a difference between the first time length and the second time length;
delaying the second transmission signal by the specified difference;
generating, based on the first transmission signal and the delayed second transmission signal, a cancellation signal for an intermodulation distortion that occurs in a received signal received by the antenna multiplexer due to intermodulation between the first transmission signal and the second transmission signal in the antenna multiplexer; and
combining the cancellation signal with the received signal.

8. The method according to claim 7, wherein
the second frequency band is different from the first frequency band.

9. The method according to claim 8, further comprising:
detecting a correlation value between the received signal and the cancellation signal;
based on the correlation value, sequentially changing a delay amount by which the second transmission signal is delayed;
specifying the correlation value in accordance with the delay amount; and
specifying the delay amount so as to maximize the specified correlation value.

10. The method according to claim 9, further comprising:
sequentially changing the delay amount at a first time interval in a first range;
specifying the correlation value in accordance with a change in the delay amount;
specifying a first delay amount with which the specified correlation value is greatest;
sequentially changing the first delay amount at a second time interval narrower than the first time interval in a second range including the first delay amount and being narrower than the first range;
specifying the correlation value in accordance with a change in the first delay amount; and
specifying the first delay amount with which the specified correlation value is greatest.

11. The method according to claim 9, further comprising:
when power of the second transmission signal exceeds a threshold, suppressing the power;
adjusting the threshold based on the correlation value;
generating the cancellation signal based on the first transmission signal, the delayed second transmission signal and the suppressed power;
specifying the correlation value in accordance with the threshold; and
specifying the threshold so as to maximize the specified correlation value.

12. The method according to claim 9, further comprising:
adjusting an average amplitude of the second transmission signal;
setting an adjustment amount of the average amplitude based on the correlation value;
generating the cancellation signal based on the first transmission signal and the second transmission signal that is delayed and the average amplitude of which is adjusted;
specifying the correlation value in accordance with the adjustment amount; and
setting the adjustment amount so as to maximize the specified correlation value.

13. A non-transitory computer-readable storage medium storing a program that causes an information processing apparatus to execute a process, the information processing apparatus being included in a wireless apparatus configured to be cascaded to another wireless apparatus through a transmission path and to be coupled to an antenna multiplexer, the another wireless apparatus being coupled to the antenna multiplexer, the process comprising:
specifying a first time length for a first transmission signal having a first frequency band to pass through the wireless apparatus;
specifying a second time length for a second transmission signal having a second frequency band to pass through the wireless apparatus, the transmission path, and the another wireless apparatus;
specifying a difference between the first time length and the second time length;
delaying the second transmission signal by the specified difference;
generating, based on the first transmission signal and the delayed second transmission signal, a cancellation signal for an intermodulation distortion that occurs in a received signal received by the antenna multiplexer due to intermodulation between the first transmission signal and the second transmission signal in the antenna multiplexer; and
combining the cancellation signal with the received signal.

14. The non-transitory computer-readable storage medium according to claim 13, wherein the second frequency band is different from the first frequency band.

15. The non-transitory computer-readable storage medium according to claim 14, further comprising:
   detecting a correlation value between the received signal and the cancellation signal;
   based on the correlation value, sequentially changing a delay amount by which the second transmission signal is delayed;
   specifying the correlation value in accordance with the delay amount; and
   specifying the delay amount so as to maximize the specified correlation value.

16. The non-transitory computer-readable storage medium according to claim 15, further comprising:
   sequentially changing the delay amount at a first time interval in a first range;
   specifying the correlation value in accordance with a change in the delay amount;
   specifying a first delay amount with which the specified correlation value is greatest;
   sequentially changing the first delay amount at a second time interval narrower than the first time interval in a second range including the first delay amount and being narrower than the first range;
   specifying the correlation value in accordance with a change in the first delay amount; and
   specifying the first delay amount with which the specified correlation value is greatest.

17. The non-transitory computer-readable storage medium according to claim 15, further comprising:
   when power of the second transmission signal exceeds a threshold, suppressing the power;
   adjusting the threshold based on the correlation value;
   generating the cancellation signal based on the first transmission signal, the delayed second transmission signal and the suppressed power;
   specifying the correlation value in accordance with the threshold; and
   specifying the threshold so as to maximize the specified correlation value.

18. The method according to claim 15, further comprising:
   adjusting an average amplitude of the second transmission signal;
   setting an adjustment amount of the average amplitude based on the correlation value;
   generating the cancellation signal based on the first transmission signal and the second transmission signal that is delayed and the average amplitude of which is adjusted;
   specifying the correlation value in accordance with the adjustment amount; and
   setting the adjustment amount so as to maximize the specified correlation value.

* * * * *